(12) United States Patent
Lee et al.

(10) Patent No.: US 7,807,989 B2
(45) Date of Patent: Oct. 5, 2010

(54) PHASE-CHANGE MEMORY USING SINGLE ELEMENT SEMIMETALLIC LAYER

(75) Inventors: Tae-yon Lee, Seoul (KR); Ki-joon Kim, Hwaseong-si (KR); Jun-ho Lee, Seongnam-si (KR); Cheol-kyu Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 119 days.

(21) Appl. No.: 12/213,234

(22) Filed: Jun. 17, 2008

(65) Prior Publication Data
US 2009/0283738 A1    Nov. 19, 2009

(30) Foreign Application Priority Data
Jan. 4, 2008    (KR) .................. 10-2008-0001431

(51) Int. Cl.
*H01L 29/02* (2006.01)
*H01L 21/336* (2006.01)
(52) U.S. Cl. ............ 257/2; 257/E27.078; 257/E27.084; 438/200; 438/266
(58) Field of Classification Search ................. 438/145, 438/152, 200, 266; 257/2, E27.078, E27.084
See application file for complete search history.

(56) References Cited

U.S. PATENT DOCUMENTS

| 7,453,081 | B2 * | 11/2008 | Happ et al. ............... 257/3 |
| 7,457,146 | B2 * | 11/2008 | Philipp et al. ............ 365/148 |
| 2007/0181932 | A1 * | 8/2007 | Happ et al. ............. 257/314 |

* cited by examiner

*Primary Examiner*—Hsien-ming Lee
(74) *Attorney, Agent, or Firm*—Harness, Dickey & Pierce, PLC (57) ABSTRACT

Provided is a phase-change memory using a single-element semimetallic thin film. The device includes a storage node having a phase-change material layer and a switching element connected to the storage node, wherein the storage node includes a single-element semimetallic thin film which is formed between an upper electrode and a lower electrode. Thus, the write speed of the phase-change memory can be increased compared with the case of a Ge—Sb—Te (GST) based material.

8 Claims, 11 Drawing Sheets

PHASE-CHANGE MEMORY USING SINGLE ELEMENT SEMIMETALLIC LAYER

CROSS-REFERENCE TO RELATED PATENT APPLICATION

This application claims the benefit of Korean Patent Application No. 10-2008-0001431, filed on Jan. 4, 2008, in the Korean Intellectual Property Office, the disclosure of which is incorporated herein in its entirety by reference.

BACKGROUND OF THE INVENTION

1. Field of the Invention

The present invention relates to a phase-change memory, and more particularly, to a phase-change memory that uses a semimetallic thin film formed of a phase-change material of a single-element, thereby increasing a write speed of the phase-change memory compared with the case of conventional Ge—Sb—Te (GST) material.

2. Description of the Related Art

A phase-change memory represents a device using difference in electrical resistance between a phase-change material in an amorphous phase and a phase-change material in a crystalline phase as a signal. Phase transformation between an amorphous phase and a crystalline phase is performed by Joule heating generated by an electrical current. Generally, in a phase-change memory, phase transformation from an amorphous phase to a crystalline phase is referred to as an operation SET, and phase transformation from a crystalline phase to an amorphous phase is referred to as an operation RESET.

In general, a Ge—Sb—Te (GST) based material is used as a phase-change material in a phase-change memory. When a semiconductor thin film formed of such a binary or ternary compound repeatedly crystallize and amorphize, the semiconductor thin film may seriously deteriorate, mainly due to the phase segregation. As a result, endurance of phase-change memory becomes significantly impeded. For example, in the case of GST, the atomic ratio of Ge, Sb and Te needs to be always maintained as 2:2:5 (i.e., $Ge_2Sb_2Te_5$), so as to ensure that phase segregation does not occur. However, in a real situation in which GST is repeatedly crystallized and amorphized, it is well known that a significant amount of Sb is segregated and the atomic ratio of GST is not maintained as 2:2:5 any longer. Also, it is very difficult to correctly adjust the atomic ratio of 2:2:5 in semiconductor fabrication and for developing sources for chemical vapor deposition (CVD), atomic layer deposition (ALD) or the like, which is essential for integrating a phase-change memory.

In addition, when a compound with many elements is used to form a phase-change layer, it takes a long time for each elemental atom constituting the compound to be placed on respective atomic sites during an operation SET for crystallization, thereby slowing down the operation SET.

SUMMARY OF THE INVENTION

The present invention provides a phase-change memory device that has a phase-change characteristic in which single-element semimetallic material is repeatedly crystallized and amorphized, thereby more rapidly and more stably operating than a conventional phase-change memory device.

Since the phase-change memory device uses a single-element material, phase segregation can be fundamentally prevented. In addition, it is easier to embody a phase-change memory device in which an operation SET is rapidly performed due to a rapid crystallization speed of the single-element material, in contrast to the case of a conventional material with many elements.

According to an aspect of the present invention, there is provided a phase-change memory device comprising a storage node including a phase-change material layer and a switching element connected to the storage node, wherein the storage node includes a single-element semimetallic thin film which is formed between an upper electrode and a lower electrode.

The semimetallic thin film may be formed of one of Sb and Bi.

The thickness of the semimetallic thin film may be in a range of 0.1 to 15 nm.

The single-element semimetallic thin film may be doped with at least one element selected from the group consisting of nitrogen, oxygen, carbon, boron and a mixture thereof.

The single-element semimetallic thin film may be doped with oxygen and nitrogen.

The thickness of the single-element semimetallic thin film may be in a range of 0.1 to 300 nm.

The single-element semimetallic thin film may be doped with nitrogen.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, a phase-change material layer of a phase-change memory, a method of manufacturing the material layer, and a phase-change memory device including the material layer manufactured using the method will be described with regard to exemplary embodiments of the invention with reference to the attached drawings. In the drawings, the thicknesses of layers and regions are exaggerated for clarity.

Figure 1:
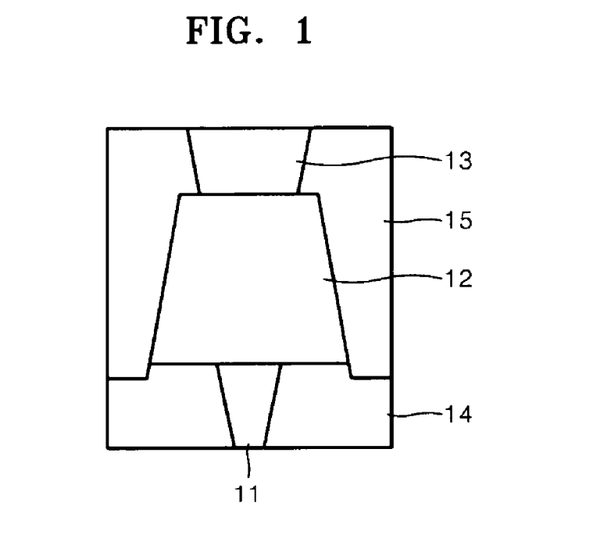
FIG. 1 is a schematic view of a phase-change memory cell according to an embodiment of the present invention.

FIG. 1 is a schematic view of a phase-change memory according to an embodiment of the present invention. A phase-change layer 12 is formed between a lower electrode 11 and an upper electrode 13 to constitute a memory node. The memory node is configured to be connected to a switching element (not shown) such as a transistor or a diode. Insulating layers 14 and 15 are formed around the lower electrode 11, the phase-change layer 12 and the upper electrode 13. Joule heating is generated when a current flows from the lower electrode 11 to the phase-change layer 12 and the upper electrode 13. In the phase-change memory, using the Joule heating, the phase-change layer 12 is repeatedly crystallized and amorphized.

Conventionally, a composite semiconductor thin film is used as a phase-change layer, wherein the semiconductor thin film is formed of a binary compound or a ternary compound such as $Ge_2Sb_2Te_5$. However, in the current embodiment, the phase-change layer 12 is formed of a single-element compound. In a conventional phase-change memory device, the phase-change layer is generally formed of a compound with many elements. In this case, when an operation SET for crystallization is performed, it takes longer for each elemental atom constituting the compound to be placed on the respective atomic sites compared with the current embodiment. That is, in the case of the phase-change memory according to the current embodiment, the phase-change layer 12 is formed of the single-element compound, and thus the operation SET can be rapidly performed.

For example, the single-element compound can be Sb or Bi, which are semimetallic. In this regard, each of Si and Bi has a characteristic in which appearance of band gap is dependent of spin-up and spin-down of a density of state (DOS). In addition, each of Si and Bi has a threshold thickness for phase-changing from an amorphous phase to a crystalline phase.

Figure 2:
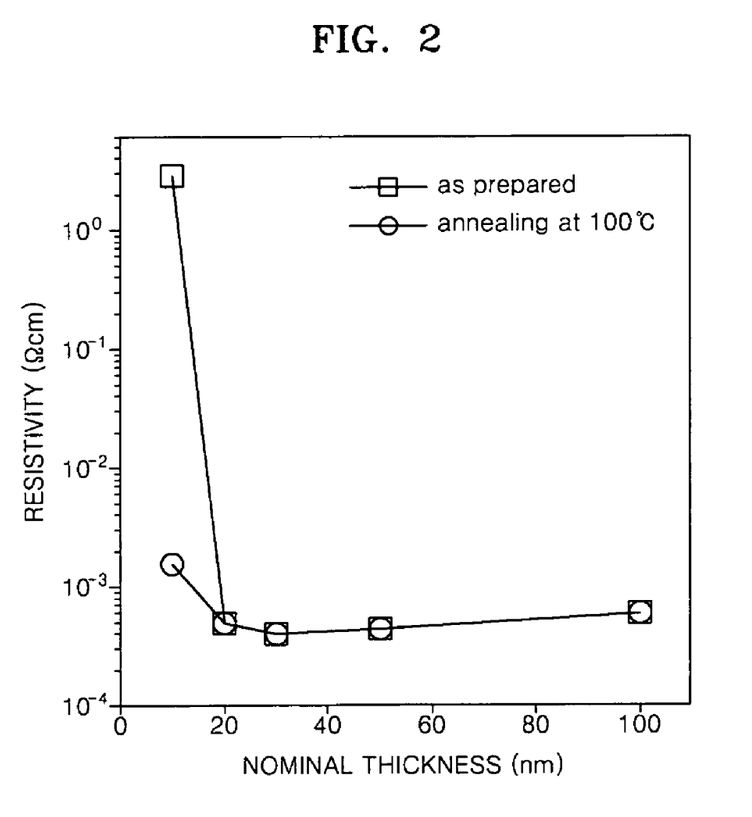
FIG. 2 is a graph illustrating a resistivity difference before and after annealing at 100° C. is performed, with respect to the thickness of an Sb thin film.
Figure 3:
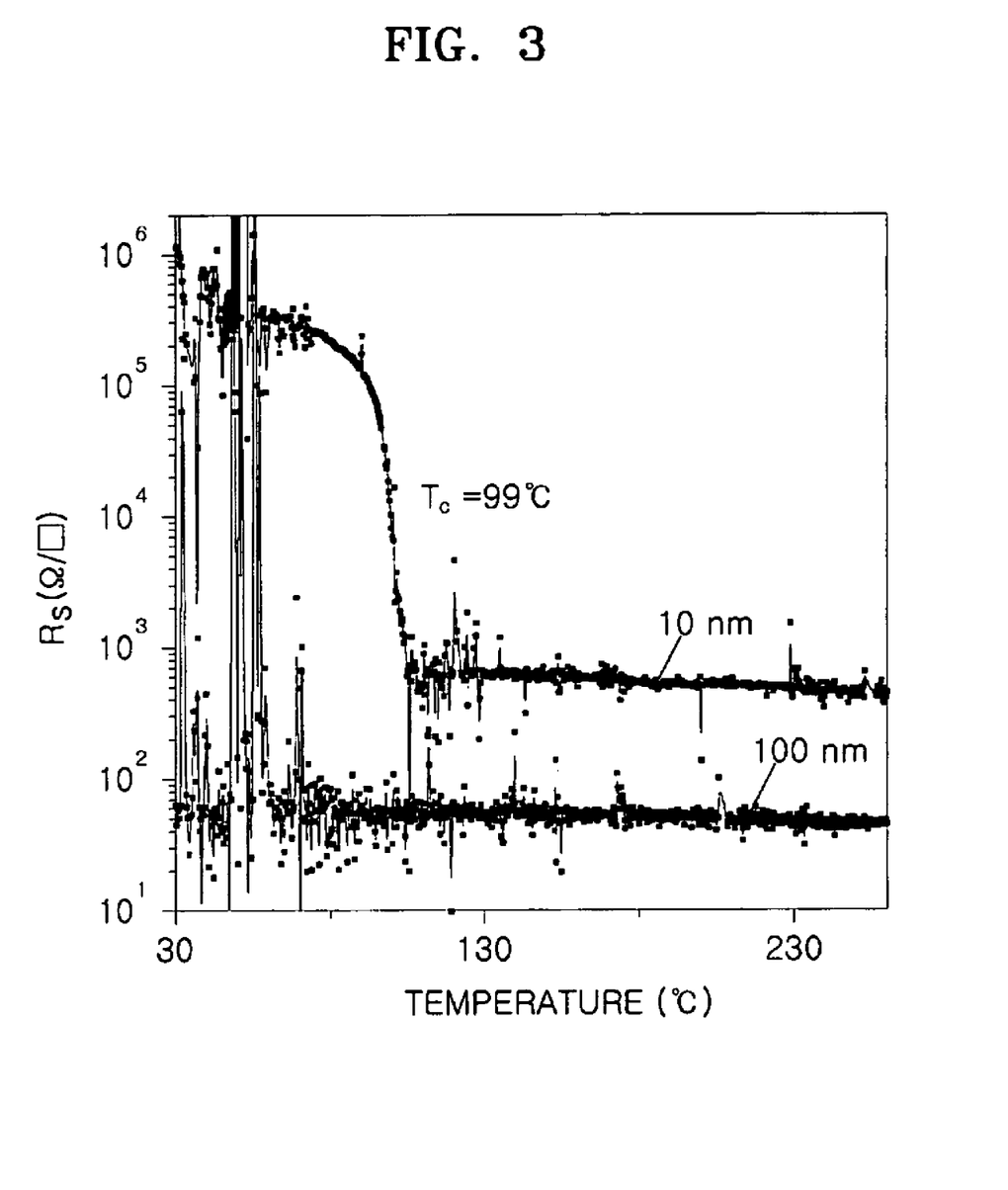
FIG. 3 is a graph illustrating a sheet resistance (Rs) of an Sb thin film having a thickness of 10 nm and 100 nm in situe measured during heating thin film.

FIG. 2 is a graph illustrating a resistivity difference before and after annealing at 100° C., with respect to the thickness of an Sb thin film. Referring to FIG. 2, when the thickness of an Sb thin film is 20 nm or more, there is no resistivity difference between the resistivity just after deposition of the Sb thin film and the resistivity after annealing. However, when the thickness of an Sb thin film is 10 nm, the resistivity just after deposition of the Sb thin film is 3 $\Omega$cm, and the resistivity after annealing at 100 degrees is $2 \times 10^{-3}$ $\Omega$cm. Thus, it can be seen that the resistivity after deposition is about 1000 times or greater than the resistivity after annealing. This is because, when the thickness of an Sb thin film is greater than 10 nm, the Sb thin film is crystalline just after deposition of the Sb thin film, and the phase of the Sb thin film is not changed regardless of annealing; however, when the thickness of an Sb thin film is smaller than 10 nm, the Sb thin film is amorphous, and the Sb thin film is crystallized if annealing is performed on the Sb thin film above 100° C. Such a tendency is more obviously illustrated in FIG. 3, which is a graph illustrating a sheet resistance (Rs) of an Sb thin film having a thickness of 10 nm or 100 nm, which is continuously measured with respect to a temperature. Since an Sb thin film having a thickness of 100 nm is crystalline just after deposition of the Sb thin film and the phase of the Sb thin film is not changed at a temperature less than 250° C., there is no Rs difference with respect to a temperature. However, when the thickness of an Sb thin film is 10 nm, the Rs of the Sb thin film is high at a temperature less than 99° C., and is low at 99° C. or more.

Figure 4:
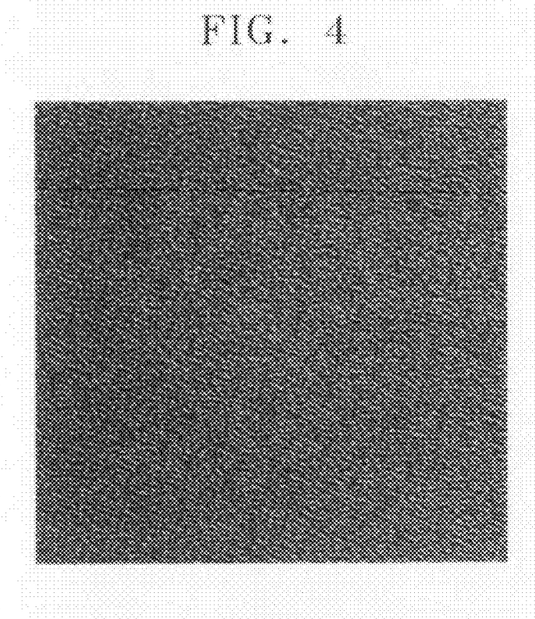
FIG. 4 is a plan view transmission electron microscopy (TEM) image of an Sb thin film having a thickness of 10 nm before annealing at 100° C.
Figure 5:
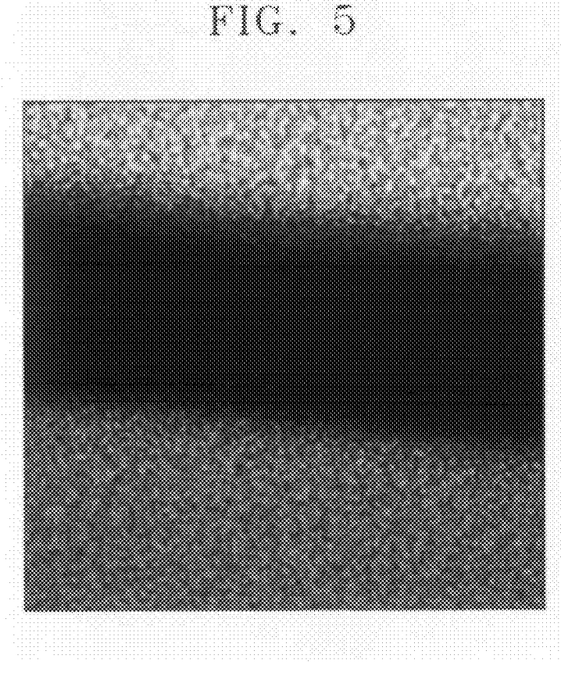
FIG. 5 is a cross sectional TEM image of an Sb thin film having a thickness of 10 nm before annealing at 100° C.
Figure 6:
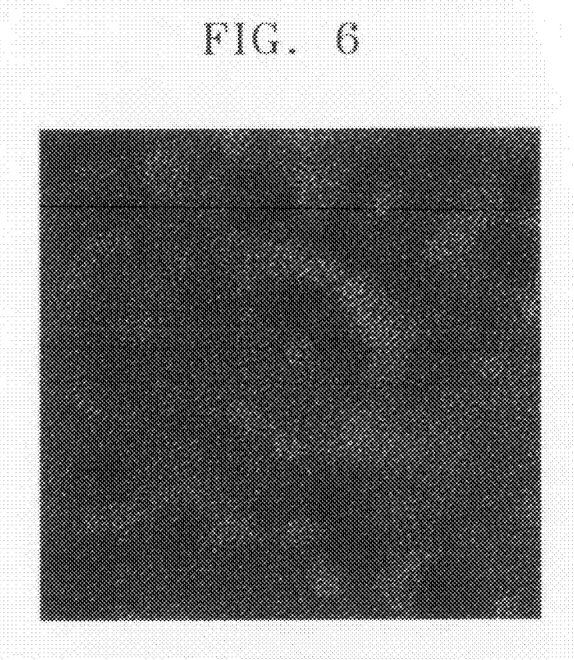
FIG. 6 is a plan view TEM image of an Sb thin film having a thickness of 10 nm after annealing at 100° C.
Figure 7:
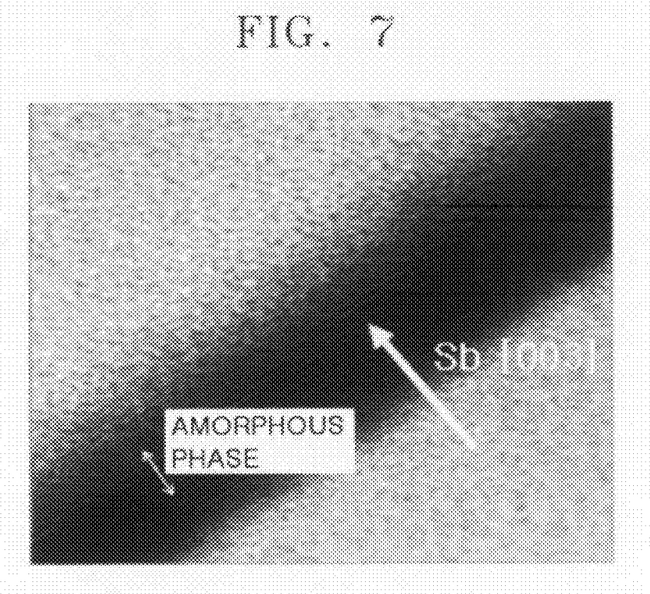
FIG. 7 is a cross sectional TEM image an Sb thin film having a thickness of 10 nm after annealing at 100° C.

In order to correctly examine whether the Sb thin film having a thickness of 10 nm is crystallized, FIGS. 4 through 7 illustrate transmission electron microscopy (TEM) images of microstructures of the Sb thin film before and after annealing at 100° C. FIGS. 4 and 5 illustrate plan-viewed and cross-sectional TEM images of the microstructure of the Sb thin film having a thickness of 10 nm just after deposition of the Sb thin film. Referring to FIGS. 4 and 5, it can be seen that the Sb thin film on which annealing is not performed is formed to have an amorphous phase that does not include any crystalline phase. FIGS. 6 and 7 illustrates plan-viewed and cross-sectional TEM images of microstructure of the Sb thin film having a thickness of 10 nm after annealing at 100° C. is performed. Referring to FIGS. 6 and 7, it can be seen that crystal structures are homogeneously formed on the Sb thin film and that the Sb thin film has a textured structure having a preferred orientation in a direction in terms of crystallography, unlike in the case of FIGS. 4 and 5.

Figure 8:
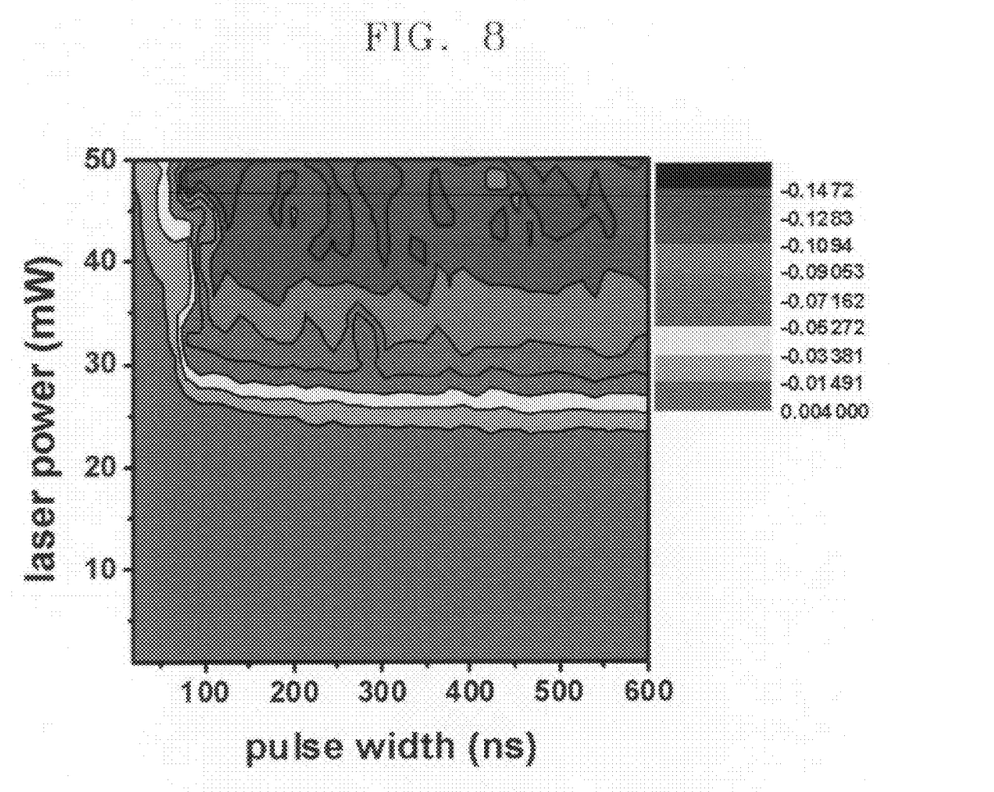
FIG. 8 is a power-time-effect (PTE) diagram of an Sb thin film having a thickness of 10 nm, which is measured by a static tester.

FIG. 8 is a power-time-effect (PTE) diagram of an Sb thin film having a thickness of 10 nm, which is measured by a static tester. When the power of a laser is less than 20 mW, there is no reflectivity change before and after laser-emission. However, when the power of a laser is 20 mW or more and a pulse is 100 nsec or more, reflectivity is rapidly reduced. This is because the Sb thin film is crystallized. That is, a crystallization time with respect to the power of a laser can be determined based on the reflectivity difference. Accordingly, when the power of a laser is 40 mW, a minimum crystallization time is less than about 50 nsec. It can be seen that the minimum crystallization time is ½ or less than that of the case of $Ge_2Sb_2Te_5$ used in a conventional phase-change memory and that the Sb thin film is much rapidly crystallized compared with the case of $Ge_2Sb_2Te_5$.

As a result, it can be summarized that semimetallic Sb having a critical thickness of 10 nm for crystallization, that the resistivity of an amorphous phase is 1000 times or greater than the resistivity of a crystalline phase, and that a crystallization temperature is 99° C. An Sb thin film having a thickness of 10 nm is rapidly crystallized at twice the speed of the case of $Ge_2Sb_2Te_5$, and a melting point of the Sb thin film is 620° C. Thus, the Sb thin film having a thickness of 10 nm can be used in a phase-change memory device that can rapidly operate.

According to an embodiment of the present invention, a phase-change layer of the phase-change memory uses a semimetallic thin film formed of a single-element compound, and the semimetallic thin film may be doped with at least one selected from the group consisting of nitrogen, oxygen, carbon, boron and a mixture thereof. In this case, when the thickness of the phase-change layer is increased, the amorphous phase of the phase-change layer can be maintained. In particular, the thickness of the phase-change layer may be in the range of 0.1 to 300 nm, but the present invention is not limited thereto. That is, the phase-change layer may be deposited to have a thickness of more than 300 nm.

Figure 9:
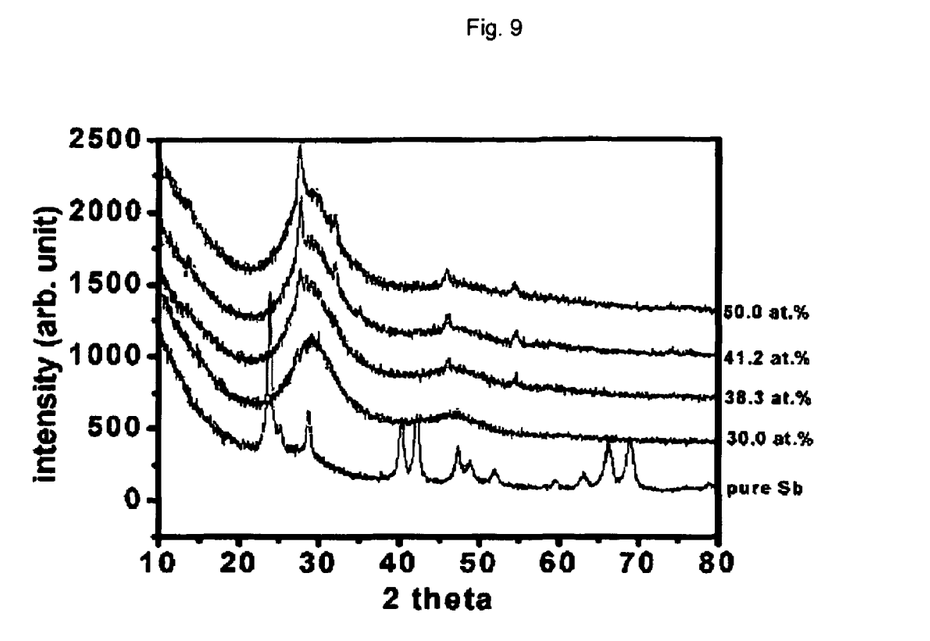
FIG. 9 is an X-ray diffraction (XRD) patterns of an as-deposited pure and nitrogen-oxygen-(ON—) doped Sb thin film having a thickness of 100 nm.

FIG. 9 is an X-ray diffraction (XRD) patterns of an as-deposited pure and nitrogen-oxygen-(ON—) doped Sb thin film having a thickness of 100 nm. The amount of nitrogen and oxygen in the ON-doped Sb films ranges from 30 to 50 at %. Referring to FIG. 9, as described above, the pure Sb thin film having a thickness of 100 nm is crystalline. However, when the Sb thin film is doped with a small amount of nitrogen, amorphous ON-doped Sb (hereinafter, referred to as ON—Sb) thin film is formed.

Figure 10:
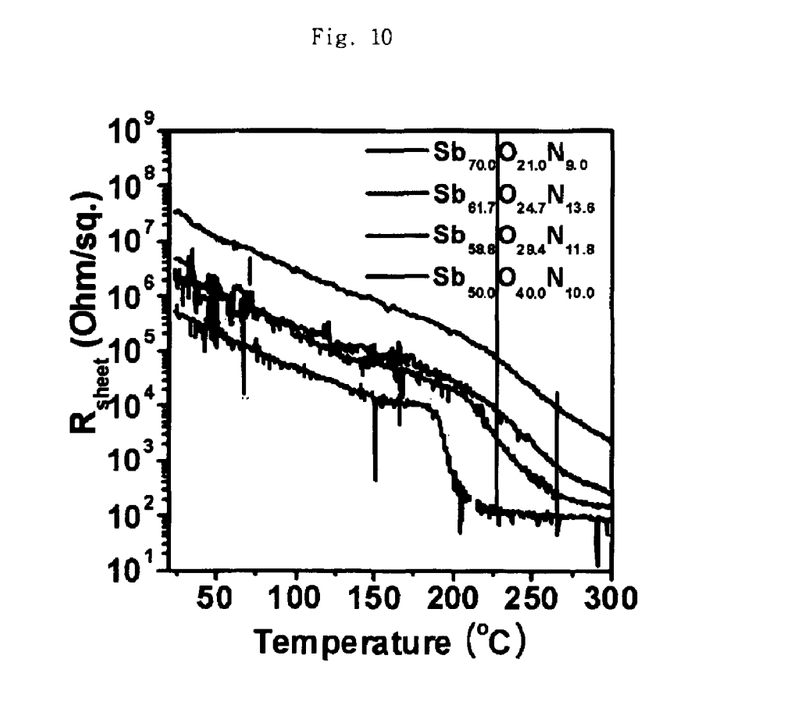
FIG. 10 illustrates a sheet resistance (Rs) of an ON—Sb thin film in situe measured during heating thin film, for various amount of nitrogen-nitrogen incorporation.

In order to use the ON—Sb thin film in the phase-change memory, significant change of resistivity occurs after crystallization of the Sb thin film. In order to check this, FIG. 10 illustrates the sheet resistance (Rs) of an ON—Sb thin film, for various amount of nitrogen and a temperature of the ON—Sb thin film, in situ measured during heating the thin film. Referring to FIG. 10, an ON—Sb thin film just after deposition of the ON—Sb thin film is amorphous, and the amorphous thin film (i.e., the ON—Sb thin film) has a high resistance at room temperature. As the temperature increases, a resistance of an ON—Sb thin film decreases. This phenomenon is usually observed for semiconductor thin film. At a threshold temperature for crystallization of an ON—Sb thin film, the Rs remarkably reduces. For example, when an ON—Sb thin film is doped with oxygen and nitrogen at 30.0 at %, the ON—Sb thin film is significantly crystallized at about 198° C.

Figure 11:
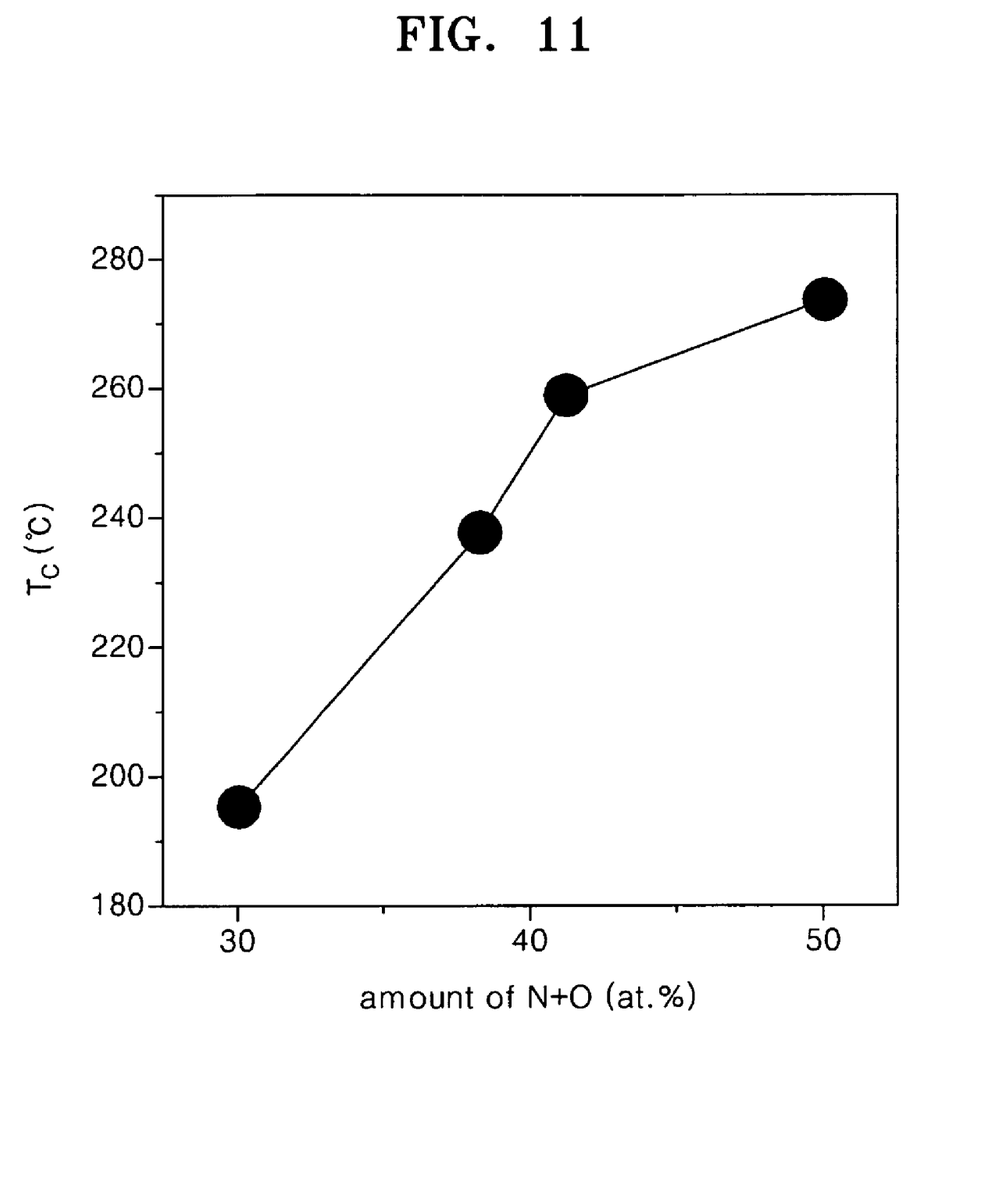
FIG. 11 is a graph of a crystallizing temperature of an ON—Sb thin film having a thickness of 100 nm with respect to amounts of oxygen and nitrogen.

FIG. 11 is a graph of a crystallation temperature of an ON—Sb thin film with respect to amounts of oxygen and nitrogen. The more oxygen and nitrogen are contained, the crystallization temperature of the ON—Sb thin film increases. Even in the case of an ON—Sb thin film in which the amount of oxygen and nitrogen is minimum (i.e., 30 at %), the crystallizing temperature is greater than 170° C. of $Ge_2Sb_2Te_5$ by about 30 degrees. That is, the phase-change memory using the ON—Sb thin film as a phase-change layer has improved stability compared with the case of $Ge_2Sb_2Te_5$.

Figure 12:
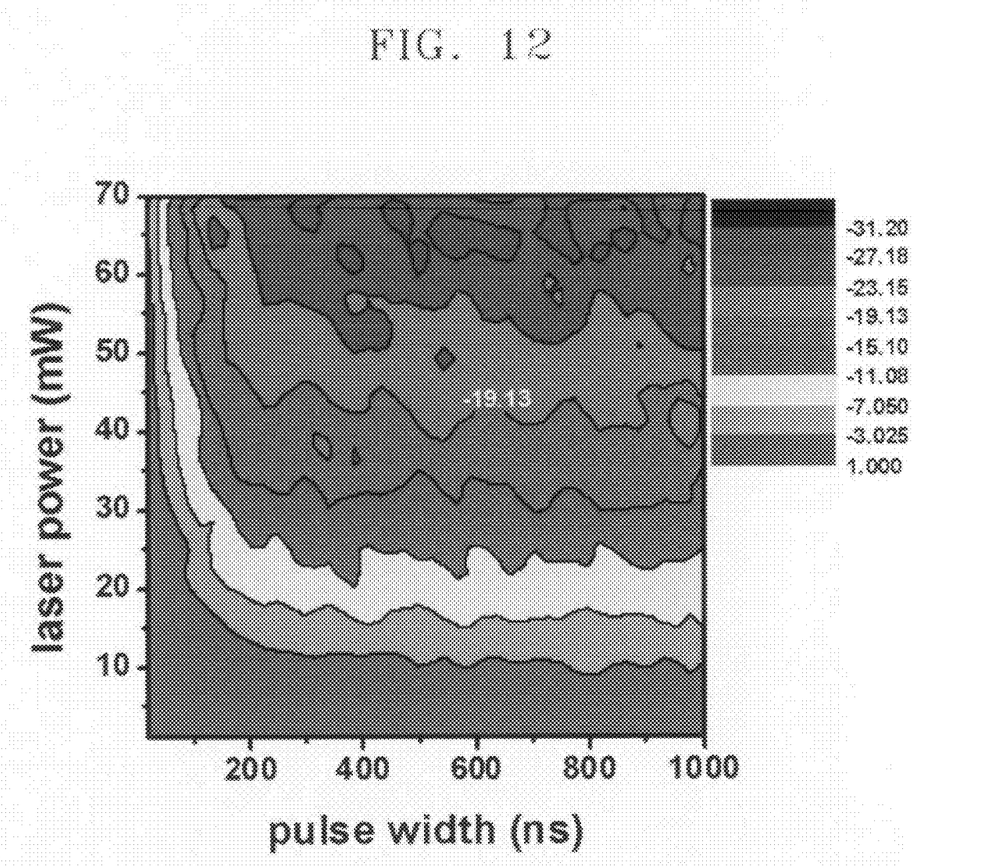
FIG. 12 is a PTE diagram of an Sb thin film having a thickness of 100 nm and doped with oxygen and nitrogen, which is measured by a static tester.

In order to examine the crystallization speed of an ON—Sb thin film, a PTE diagram of an Sb thin film doped with oxygen and nitrogen at 30.0 at % is measured by a static tester as in FIG. 12. Referring to FIG. 12, when the ON—Sb thin film is crystallized, the reflectivity of the ON—Sb thin film is remarkably reduced. The minimum power of a laser for crystallizing is about 10 mW. The minimum crystallization time for laser having a power of 40 mW is about 45 ns. Compared with the case of FIG. 8, the minimum crystallization times are similar to the case of FIG. 8. However, the crystallization speed in the case of FIG. 12 is twice the crystallization speed of the case of $Ge_2Sb_2Te_5$.

Figure 13:
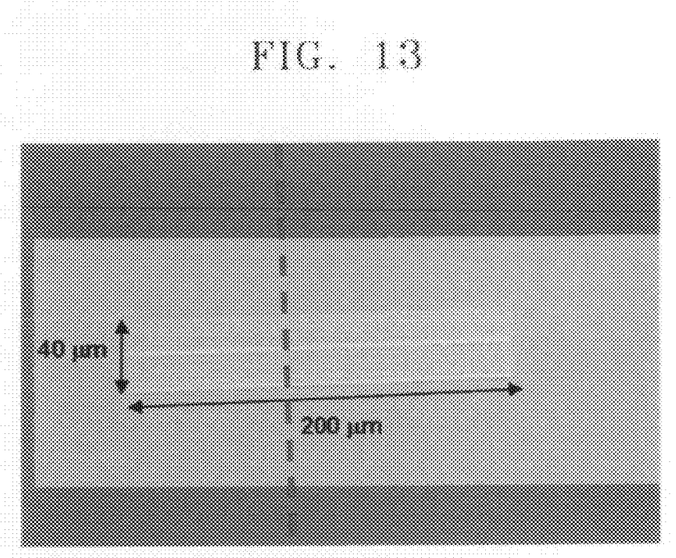
FIG. 13 illustrates a crystallization mark of an ON—Sb thin film, which is formed by a static tester.

FIG. 13 illustrates a crystallization mark of an ON—Sb thin film, which is formed by a static tester. Here, the marking conditions of 70 mW and 200 nsec is obtained from FIG. 11. Referring to FIG. 13, it can be seen that the crystallization mark has reflectivity that is obviously different from that of the amorphous part around the crystallization mark.

Figure 14:
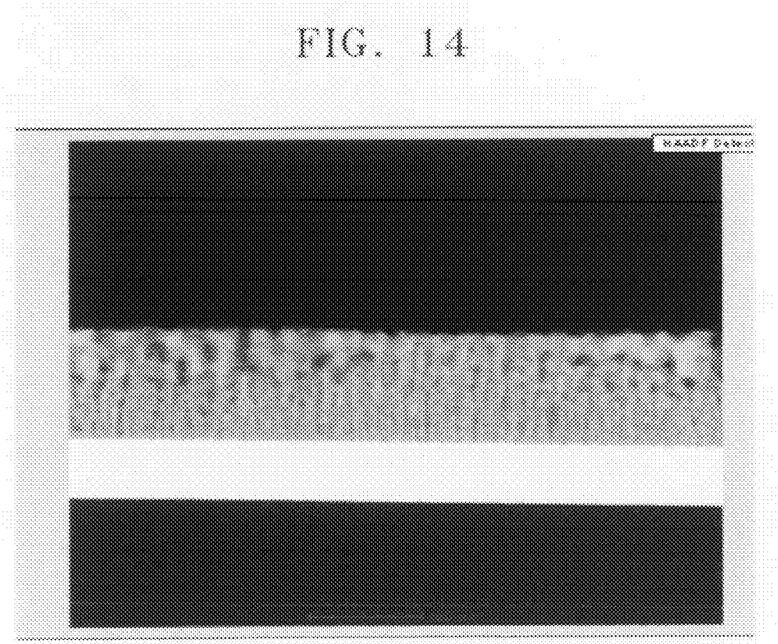
FIG. 14 is a cross sectional TEM image of a cross section of the crystallization mark of an ON—Sb thin film having a thickness of 100 nm, which is formed by a static tester.
Figure 15:
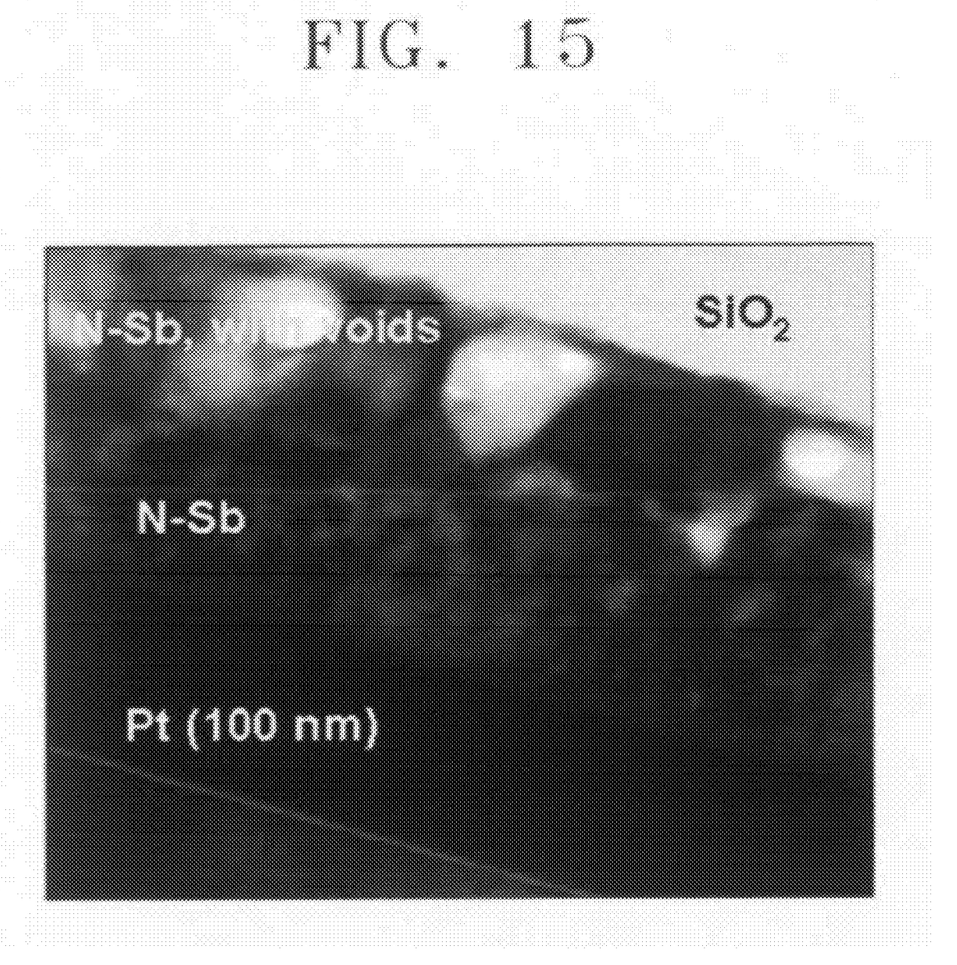
FIG. 15 illustrates a high resolution cross sectional TEM image of the same part as illustrated in FIG. 14.

FIG. 14 is a cross-sectional TEM image of the crystallization mark of an ON—Sb thin film having a thickness of 100 nm, which is formed by a static tester. Referring to FIG. 14, the ON—Sb thin film is crystallized by laser beam irradiation. As a result, two distinct layers formed in the ON—Sb, in which the underlayer has a pillar microstructure. In order to precisely check this, FIG. 15 illustrates a high resolution TEM image of the same part as illustrated in FIG. 14. Like in the case of FIG. 14, a region on which crystallization is performed and a region including voids can be resolved. The voids are interpreted to form when nitrogen and oxygen, which deviate from equilibrium stoichiometry during phase-change, separate from the ON—Sb thin film. That is, when a phase-change memory device is actually manufactured, a void overlayer is formed, wherein the void layer functions as a protective layer solving problems, such as sublimation of an ON—Sb thin film, which occur during repeat operations of the phase-change memory.

As described above, it is shown that an Sb thin film doped with oxygen and nitrogen is crystallized at a rapid crystallization speed and a high crystallization temperature. In addition, by observing a microstructure, it is shown that a void layer protecting a phase-change layer can be formed. Thus, a phase-change memory using an ON—Sb layer as the phase-change layer can operate with increased stability at a higher speed in comparison to the case of a conventional phase-change memory using $Ge_2Sb_2Te_5$.

Figure 16:
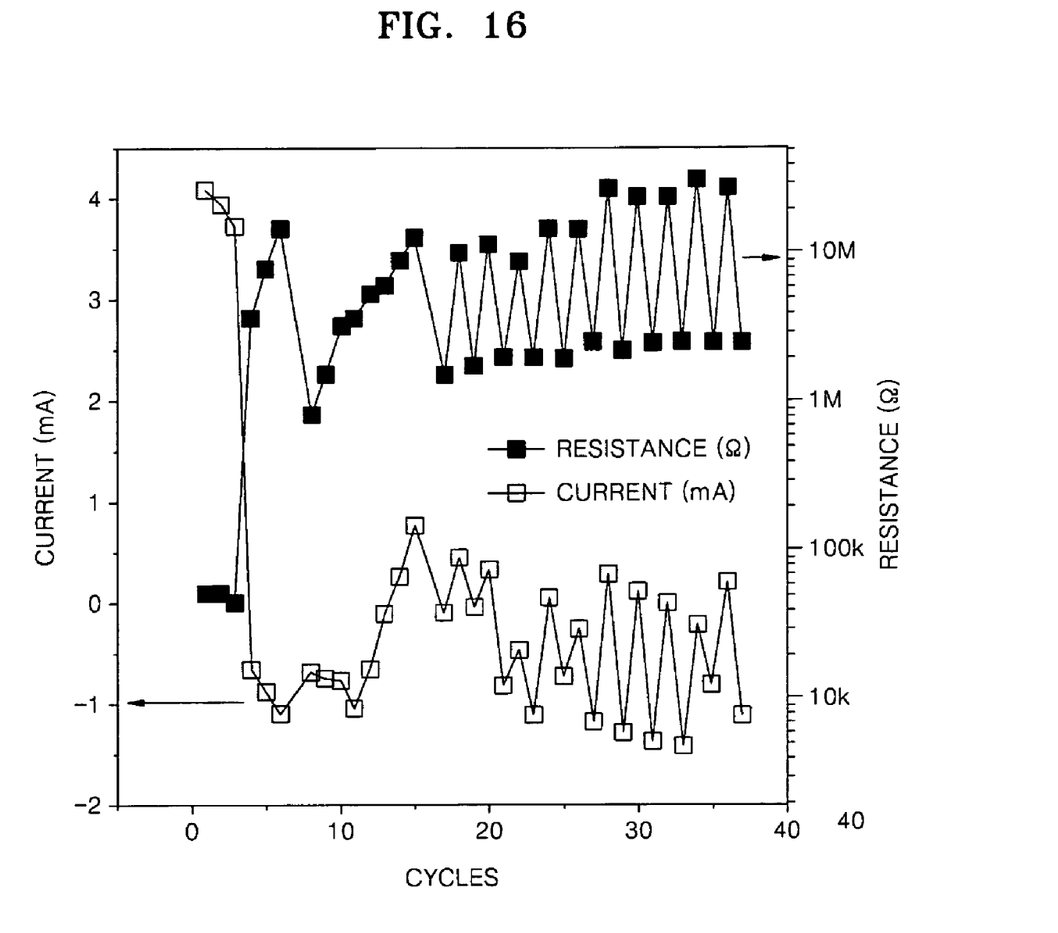
FIG. 16 illustrates operations SET and RESET of a phase-change memory using an N—Sb thin film having a thickness of 200 nm.

In order to check this, FIG. 16 illustrates the operational characteristic of a phase-change memory using an Sb thin film doped with nitrogen as a phase-change layer. Here, the phase-change memory has the same structure as that of the phase-change memory of FIG. 1, and the phase-change layer is formed of N-doped Sb containing nitrogen of 10 at %. Here, a horizontal axis represents the cycle of phase-change to crystalline phase and amorphous phase, and a vertical axis is a current or resistance of SET and RESET states. Referring to FIG. 16, under the pulse conditions of about 2.5 V and 1000 nsec, a stable SET state can be obtained. Under the pulse conditions of about 4.2 V and 50 nsec, a current having a mean value of 1.7 mA flows, and a RESET state can be obtained. When RESET pulse conditions are fixed at 4.2 V and 50 nsec, the amplitude of a SET pulse is maintained at 2.5 V, a pulse width is reduced to 200, 180, 160 . . . 20, 200 nsec, and operations SET-RESET are repeatedly performed. As a result, it can be seen that operation SET is performed even when a minimum pulse width is 20 nsec. This proves that the above-described N—Sb thin film can be used in a phase-change memory device that can rapidly and stably operate.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A phase-change memory device, comprising:
  a storage node including a phase-change material layer; and
  a switching element connected to the storage node, wherein the storage node includes a single-element semimetallic thin film which is formed between an upper electrode and a lower electrode, the single-element semimetallic thin film having a thickness in a range of 0.1 nm to 15 nm.

2. The device of claim 1, wherein the semimetallic thin film is formed of one of antimony (Sb) and bismuth (Bi).

3. The device of claim 1, wherein the single-element semimetallic thin film is adapted to change between an amorphous phase and a crystalline phase.

4. A phase-change memory device, comprising:
  a storage node including a phase-change material layer; and
  a switching element connected to the storage node, wherein the storage node includes a single-element semimetallic thin film which is between an upper electrode and a lower electrode, the single-element semimetallic thin film being doped with at least one selected from the group consisting of nitrogen, oxygen, carbon, boron and a mixture thereof.

5. The device of claim 4, wherein the single-element semimetallic thin film is doped with oxygen and nitrogen.

6. The device of claim 5, wherein a thickness of the single-element semimetallic thin film is in a range of 0.1 nm to 300 nm.

7. The device of claim 4, wherein the single-element semimetallic thin film is doped with nitrogen.

8. The device of claim 7, wherein a thickness of the single-element semimetallic thin film is in a range of 0.1 nm to 300 nm.

\* \* \* \* \*